(12) United States Patent
Miyamoto (10) Patent No.: US 10,522,966 B2
(45) Date of Patent: Dec. 31, 2019

(54) LASER APPARATUS

(71) Applicant: Gigaphoton Inc., Tochigi (JP)

(72) Inventor: Hirotaka Miyamoto, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/123,328

(22) Filed: Sep. 6, 2018

(65) Prior Publication Data

US 2019/0006814 A1 Jan. 3, 2019

Related U.S. Application Data

(63) Continuation of application No. PCT/JP2016/062858, filed on Apr. 22, 2016.

(51) Int. Cl.
*H01S 3/1055* (2006.01)
*G03F 7/20* (2006.01)
(Continued)

(52) U.S. Cl.
CPC ........ *H01S 3/1055* (2013.01); *G03F 7/70025* (2013.01); *G03F 7/70575* (2013.01); *H01S 3/038* (2013.01); *H01S 5/0064* (2013.01)

(58) Field of Classification Search
CPC ...... H01S 3/1055; H01S 3/038; H01S 5/0064; H01S 3/00; G03F 7/70025; G03F 7/70575

See application file for complete search history.

(56) References Cited

U.S. PATENT DOCUMENTS

| | | | |
|---|---|---|---|
| 2001/0014110 A1* | 8/2001 | Partlo | G03F 7/70025 372/100 |
| 2008/0181262 A1* | 7/2008 | Wakabayashi | H01S 3/106 372/9 |
| 2015/0325980 A1 | 11/2015 | Fujita et al. | |

FOREIGN PATENT DOCUMENTS

| | | |
|---|---|---|
| JP | H03-120772 A | 5/1991 |
| JP | H05-013890 A | 1/1993 |

(Continued)

OTHER PUBLICATIONS

International Search Report issued in PCT/JP2016/062858; dated Jul. 19, 2016.

(Continued)

*Primary Examiner* — Xinning (Tom) Niu
(74) *Attorney, Agent, or Firm* — Studebaker & Brackett PC (57) ABSTRACT

A laser apparatus includes: a laser chamber in which a pair of discharge electrodes is provided; a first beam expander configured to expand a beam width of a beam outputted from the laser chamber at least in a first direction substantially parallel to a direction of electric discharge between the discharge electrodes; and a line narrow optical system including: a second beam expander configured to expand a beam width of the beam outputted from the laser chamber at least in a second direction substantially perpendicular to the first direction, the second beam expander including at least one optical element; and a grating configured to perform wavelength dispersion of the beam expanded by the first and second beam expanders, the wavelength dispersion being performed in a plane substantially parallel to the second direction, wherein at least one of the grating and the at least one optical element is arranged so as to compensate for wavelength dispersion caused by the first beam expander.

12 Claims, 7 Drawing Sheets

(51) Int. Cl.
*H01S 3/038* (2006.01)
*H01S 5/00* (2006.01)

(56) References Cited

FOREIGN PATENT DOCUMENTS

| JP | 2003-518757 A | 6/2003 |
|---|---|---|
| JP | 3590524 B2 | 11/2004 |
| JP | 2006-024766 A | 1/2006 |
| JP | 4358052 B2 | 11/2009 |

OTHER PUBLICATIONS

International Preliminary Report on Patentability (Chapter I) and Written Opinion of the International Searching Authority; PCT/JP2016/062858; dated Oct. 23, 2018.

* cited by examiner

LASER APPARATUS

CROSS-REFERENCE TO RELATED APPLICATIONS

The present application is a continuation application of International Application No. PCT/JP2016/062858 filed on Apr. 22, 2016. The content of the application is incorporated herein by reference in its entirety.

TECHNICAL FIELD

The present disclosure relates to a laser apparatus.

BACKGROUND ART

The recent miniaturization and increased levels of integration of semiconductor integrated circuits have led to a demand for increases in resolutions of semiconductor exposure apparatuses. A semiconductor exposure apparatus is hereinafter referred to simply as "exposure apparatus". Accordingly, exposure light sources to output light at shorter wavelengths have been under development. As the exposure light sources, gas laser apparatuses instead of conventional mercury lamps are typically used. The gas laser apparatuses for exposure include a KrF excimer laser apparatus that outputs an ultraviolet laser beam at a wavelength of 248 nm and an ArF excimer laser apparatus that outputs an ultraviolet laser beam at a wavelength of 193 nm.

As a current exposure technology, immersion exposure has been put to practical use. In the immersion exposure, a gap between a projection lens and a wafer in an exposure apparatus is filled with a fluid such as water to change refractive index in the gap, such that an apparent wavelength of the light from the exposure light source is shortened. In a case where immersion exposure is performed using an ArF excimer laser apparatus as an exposure light source, a wafer is irradiated with ultraviolet light whose wavelength in water is equivalent to 134 nm. This technology is referred to as "ArF immersion exposure". The ArF immersion exposure is also referred to as "ArF immersion lithography".

Spectrum line widths of KrF and ArF excimer laser apparatuses in natural oscillation are as wide as approximately 350 pm to 400 pm. This causes a chromatic aberration of a laser beam (ultraviolet light) that is subjected to reduced projection onto a wafer by a projection lens in an exposure apparatus. The chromatic aberration thus causes a reduction in resolving power. Accordingly, spectrum line width of a laser beam that is outputted from a gas laser apparatus needs to be narrowed to such an extent that the chromatic aberration can be ignored. The spectrum line width is also referred to as "spectrum width". To narrow the spectrum width, a laser resonator of a gas laser apparatus is equipped with a line narrow optical system (line narrow module) having a line narrow element. The line narrow element may be an etalon, a grating, or the like. A laser apparatus whose spectrum width is narrowed in this way is referred to as "line narrowed laser apparatus".

Patent Document 1: US Patent Application Publication No. 2001/0014110 A

Patent Document 2: Japanese Patent No. 4358052 B

Patent Document 3: US Patent Application Publication No 2015/0325980 A

Patent Document 4: Japanese Patent No. 3590524 B

SUMMARY

An aspect of the present disclosure relates to a laser apparatus including a laser chamber in which a pair of discharge electrodes is provided, a first beam expander configured to expand a beam width of a beam outputted from the laser chamber at least in a first direction substantially parallel to a direction of electric discharge between the discharge electrodes, and a line narrow optical system including a second beam expander configured to expand a beam width of the beam outputted from the laser chamber at least in a second direction substantially perpendicular to the first direction, the second beam expander including at least one optical element, and a grating configured to perform wavelength dispersion of the beam expanded by the first and second beam expanders, the wavelength dispersion being performed in a plane substantially parallel to the second direction. Here, at least one of the grating and the at least one optical element is arranged so as to compensate for wavelength dispersion caused by the first beam expander.

Another aspect of the present disclosure relates to a laser apparatus including a laser chamber in which a pair of discharge electrodes is provided, a grating configured to perform wavelength dispersion of a beam outputted from the laser chamber, a first beam expander provided in a beam path between the laser chamber and the grating and configured to expand a beam width of the beam at an incident position on the grating at least in a first direction substantially perpendicular to a plane of dispersion of the grating, and a second beam expander provided in a beam path between the laser chamber and the grating and configured to expand a beam width of the beam at an incident position on the grating at least in a second direction substantially parallel to the plane of dispersion of the grating, the second beam expander including at least one optical element. Here, at least one of the grating and the at least one optical element is arranged so as to compensate for wavelength dispersion caused by the first beam expander.

BRIEF DESCRIPTION OF DRAWINGS

Exemplary embodiments of the present disclosure will be described below as mere examples with reference to the appended drawings.

DESCRIPTION OF EMBODIMENTS

<Content>
  1. Summary
  2. Laser Apparatus with Inclined Grating That Compensates for Wavelength Dispersion Caused by First Beam Expander
    2.1 Configuration
      2.1.1 Laser Chamber
      2.1.2 Line Narrow Optical System
      2.1.3 Output Coupling Mirror
      2.1.4 First Beam Expander
    2.2 Operation
    2.3 Compensating fog Wavelength Dispersion
  3. Laser Apparatus with Inclined Prism of Second Beam Expander That Compensates for Wavelength Dispersion Caused by First Beam Expander
  4. Case where First Beam Expander is Inverted Upside Down
  5. Angle Changing Mechanism for Grating
  6. Angle Changing Mechanism for Prism
  7. Others Embodiments of the present disclosure will be described in detail below with refer Ice to the drawings. The embodiments described below indicate several examples of the present disclosure, and may not intend to limit the content of the present disclosure. Not all of the configurations and operations described in the embodiments are indispensable in the present disclosure. Identical reference symbols are assigned to identical constituent elements and redundant descriptions thereof are omitted.

1. Summary

In an aspect of the present disclosure, a laser apparatus includes a laser chamber, a first beam expander, and a line narrow optical system. A pair of discharge electrodes is provided in the laser chamber. A first beam expander and a line narrow optical system are provided outside the laser chamber. The line narrow optical system includes a second beam expander and a grating.

The first beam expander includes a plurality of prisms. The first beam expander expands a beam, outputted from the laser chamber, in a first direction substantially parallel to the direction of electric discharge between the discharge electrodes.

The second beam expander dudes at least one prism. The second beam expander expands the beam, outputted from the laser chamber, in a second direction substantially perpendicular to the direction of electric discharge between the discharge electrodes.

The beam expanded by the first beam expander and the second beam expander is incident on the grating. The beam incident on the grating may be subject to wavelength dispersion in a plane substantially parallel to the second direction.

Further, at least one of the grating and the optical elements of the second beam expander is arranged to compensate for the wavelength dispersion caused by the first beam expander.

The words such as "perpendicular to" or "parallel to" the present application do not intend to strictly define the numerical value of the angle or the like but intend to allow a practically acceptable range of error.

Figure 1:
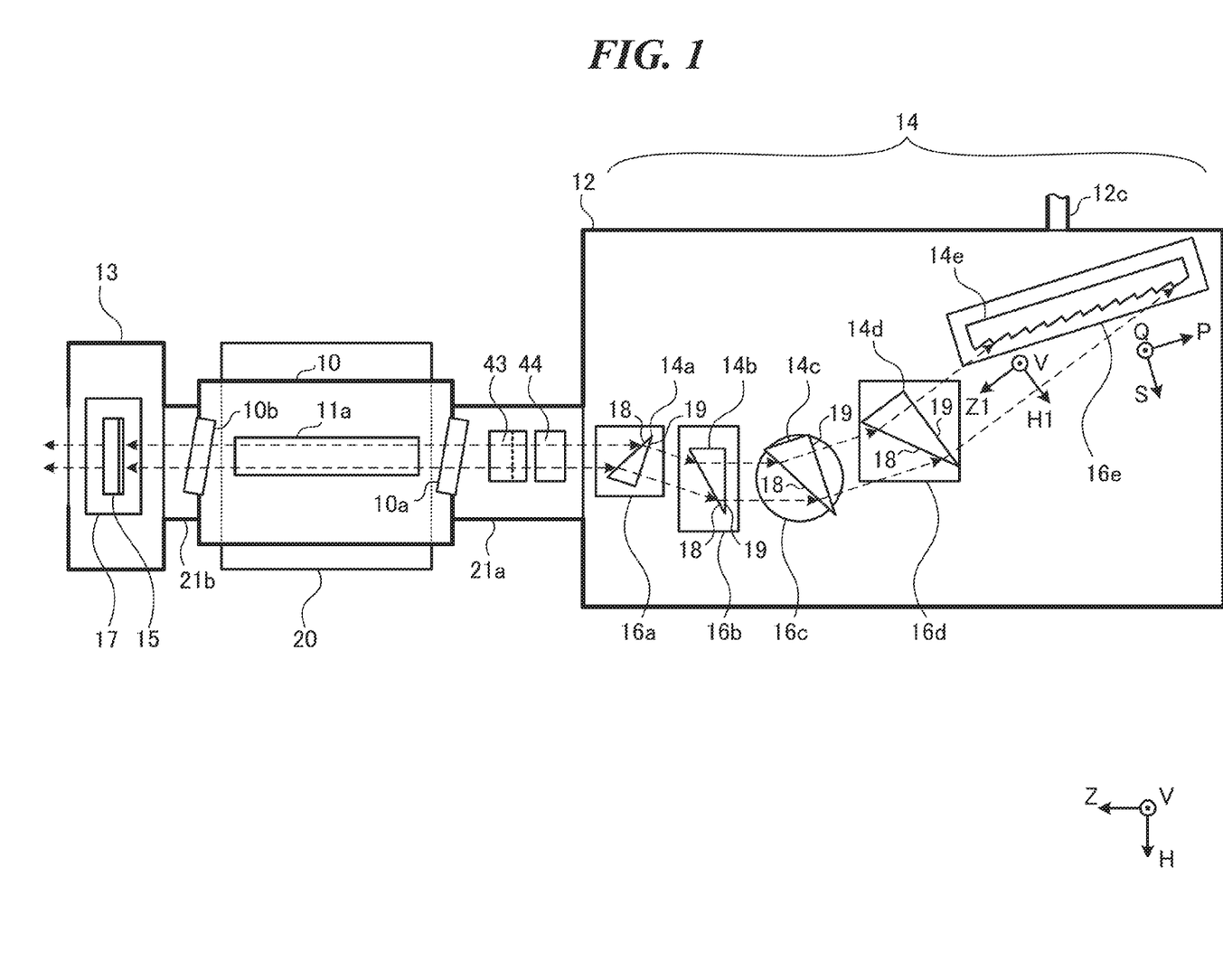
FIG. 1 schematically shows a configuration of a laser apparatus according to a first embodiment of the present disclosure.
Figure 2:
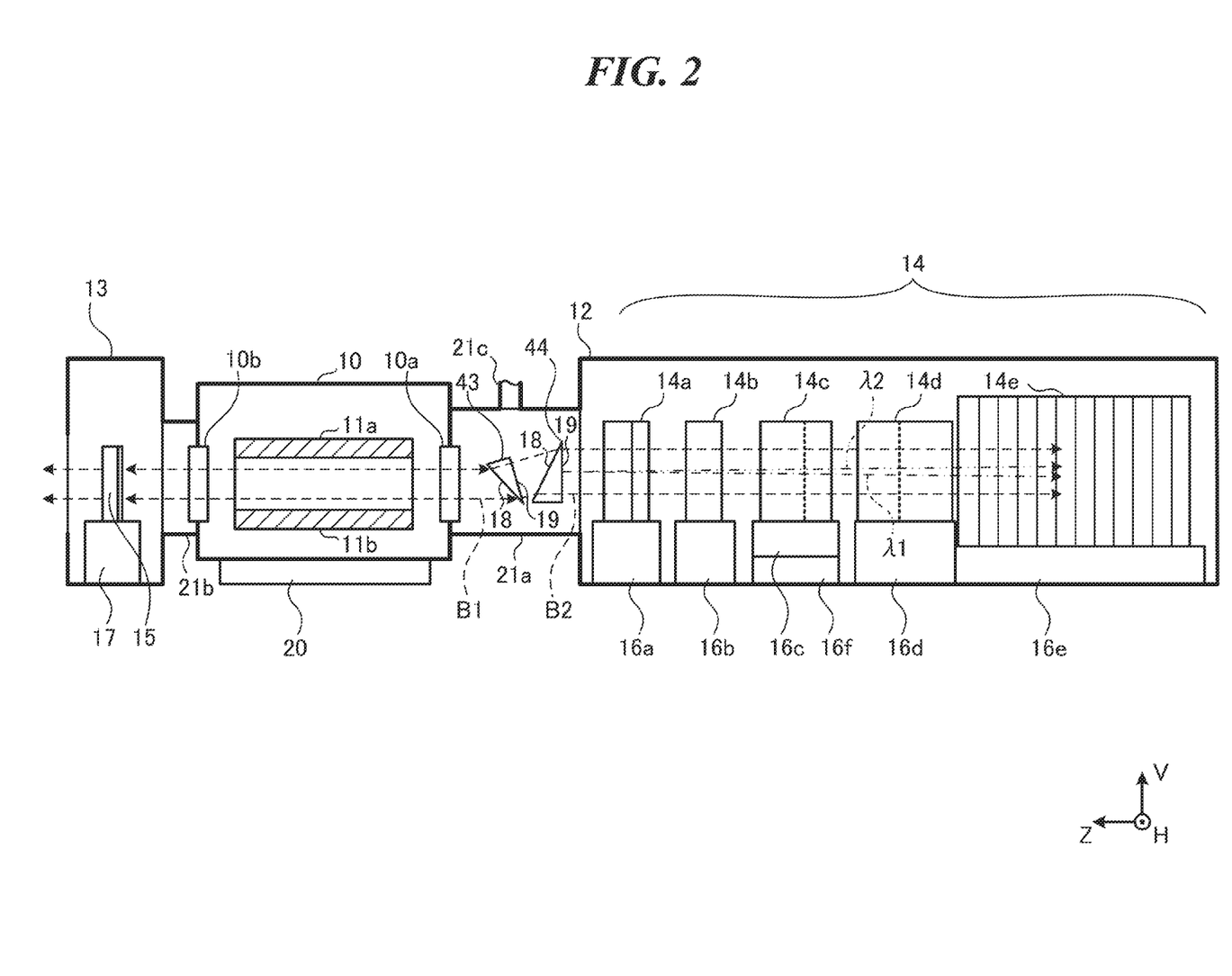
FIG. 2 schematically shows the configuration of the laser apparatus according to the first embodiment of the present disclosure.

2. Laser Apparatus with Inclined Grating That Compensates for Wavelength Dispersion Caused by First Beam Expander 2.1 Configuration FIGS. 1 and 2 schematically show a configuration of a laser apparatus according to a first embodiment of the present disclosure. The laser apparatus shown in FIGS. 1 and 2 includes a laser chamber 10, a pair of discharge electrodes 11a and 11b, a line narrow optical system 14, and an output coupling mirror 15. The line narrow optical system 14 and the output coupling mirror 15 constitute an optical resonator. The laser chamber 10 is provided in an optical path of the optical resonator. The laser apparatus is a master oscillator that performs laser oscillation to output a seed beam that enters an unillustrated amplifier.

FIG. 1 shows an internal configuration of the laser apparatus as viewed in a direction substantially parallel to the direction of electric discharge between the discharge electrodes 11a and 11b. FIG. 2 shows the internal configuration of the laser apparatus as viewed in a direction substantially perpendicular to the direction of electric discharge between the discharge electrodes 11a and 11b and substantially perpendicular to the traveling direction of the laser beam outputted from the output coupling mirror 15. The traveling direction of the laser beam outputted from the output coupling 15 is a Z direction. The direction of electric discharge between the discharge electrodes 11a and 11b is a V direction or a −V direction. A direction perpendicular to these directions is an H direction. The −V direction substantially coincides with the direction of gravity.

2.1.1 Laser Chamber

The laser chamber 10 contains a laser gas including, as a laser medium, a rare gas such as argon gas or krypton gas, a halogen gas such as fluorine gas, and a buffer gas such as neon gas. Windows 10a and 10b are provided at the respective ends of the laser chamber 10. The laser chamber 10 is held by a holder 20.

The discharge electrodes 11a and 11b are provided in the laser chamber 10 as electrodes to excite the laser medium by electric discharge. An unillustrated pulse power module applies a pulsed high voltage across the discharge electrodes 11a and 11b.

As shown in FIG. 1, the windows 10a and 10b are arranged such that the plane of incidence of the light incident on these windows is substantially parallel to an HZ plane and the angle of incidence of the light is substantially equal to Brewster's angle.

2.1.2 Line Narrow Optical System

The line narrow optical system 14 includes at least one prism, a grating 14e, holders 16a to 16e, and a housing 12. The at least one prism includes four prisms 14a to 14d that expand the beam in the H direction substantially perpendicular to the direction of electric discharge. The prisms 14a to 14d may constitute a second beam expander in the present disclosure. The H direction may correspond to a second direction in the present disclosure.

Each of the four prisms 14a to 14d is configured by a calcium fluoride crystal. Each of the four prisms 14a to 14d has two surfaces 18 and 19 through which the beam passes. These prisms are arranged such that the beam passing through the surface 18 is non-perpendicular to the surface 18 and the beam passing through the surface 19 is substantially perpendicular to the surface 19. At the surface 18, the beam is refracted to cause wavelength dispersion in a plane perpendicular to the V axis. At the surface 19, the beam is refracted little. The surface 18 is coated with a film to suppress reflection of at least p-polarized light included in the laser beam. The surface 19 is coated with a film to suppress reflection of the laser beam. The grating 14e is an echelle grating including at its surface a high reflectance material and having multiple grooves formed at a predetermined interval.

The housing 12 stores the prisms 14a to 14d, the grating 14e, and the holders 16a to 16e. In the housing 12, the prisms 14a, 14b, 14c, 14d, and the grating 14e are held by the holders 16a, 16b, 16c, 16d, and 16e respectively. To adjust the oscillation wavelength, a rotary stage 16f is capable of rotating the holder 16c, which holds the prism 14c, around an axis parallel to a V axis.

The housing 12 is connected via an optical path tube 21a to the laser chamber 10. The optical path tube 21a and the housing 12 are capable of communicating with each other. An inert gas inlet pipe 12c is connected to the housing 12 at a position spaced apart from the position connected to the optical path tube 21a. An inert gas outlet pipe 21c is connected to the optical path tube 21a at a position spaced apart from the position connected to the housing 12. Inert gas is supplied from the inert gas inlet pipe 12c to the housing 12 and emitted from the optical path tube 21a through the inert gas outlet pipe 21c to purge the interior of the housing 12.

2.1.3 Output Coupling Mirror

The output coupling mirror 15 is provided in a housing 13. The output coupling 15 is held in the housing 13 by a holder 17. The surface of the output coupling mirror 15 facing the chamber 10 is coated with a partially reflective film and the opposite surface is coated with an anti reflective film.

The housing 13 is connected via optical path tube 21b to the laser chamber 10. The optical path tube 2 and the housing 13 are capable of communicating with each other. An unillustrated inert gas inlet pipe and an unillustrated inert gas outlet pipe are connected to the optical path tube 21b and the housing 13, respectively. The interior of the optical path tube 21b and the housing 13 is purged by inert gas.

2.1.4 First Beam Expander

The laser apparatus according to the first embodiment includes a first beam expander to expand the beam in the V direction substantially parallel to the direction of electric discharge. The first beam expander includes a plurality of prisms 43 and 44. The prisms 43 and 44 are provided in the optical path between the window 10a and the grating 14e. The V direction corresponds to a first direction in the present disclosure.

The prisms 43 and 44 are provided in the optical path tube 21a. The prisms 43 and 44 are provided in the optical path between the window 10a and the prism 14a nearest to the window 10a. Namely, the prisms 14a to 14d are all arranged between the prisms 43 and 44 and the grating 14e. Since the prisms 43 and 44 are provided in the space Where the beam width of the light outputted from the window 10a is small before being expanded by the prism 14a, the prisms 43 and 44 may be small sized prisms.

Each of the prisms 43 and 44 is configured by a calcium fluoride crystal. Each of the prisms 43 and 44 has two surfaces 18 and 19 through which the beam passes. These prisms are arranged such that the beam passing through the surface 18 is non-perpendicular to the surface 18 and the beam passing through the surface 19 is substantially perpendicular to the surface 19. At the surface 18, the beam is refracted to cause wavelength dispersion in a plane parallel to the VZ plane. At the surface 19, the beam is refracted little. The surface 18 of each of the prisms 43 and 44 is coated with a film to suppress reflection of at least s-polarized light included in the laser beam. The surface 19 of each of the prisms 43 and 44 is coated with a film to suppress reflection of the laser beans. The prisms 43 and 44 thus suppress reflection of the polarized light component polarized in the H direction and transmit the polarized light component polarized in the H direction at a high transmittance.

The magnification Mv of the beam width in the V direction magnified by the prisms 43 and 44 is preferably 1.1 or more and 4 or less. The magnification Mv of the beam width in the V direction magnified by the prisms 43 and 44 is preferably lower than the magnification Mh of the beam width in the H direction magnified by the four prisms 14a to 14d.

The prisms 43 and 44 may not necessarily expand the beam width the H direction. In that case, the function of the prisms 43 and 44 is clearly distinguished from the function of the prisms 14a to 14d, which expand the beam width in the H direction. This makes the design of the optical system simple.

The prisms 43 and 44 cause a second beam B2 extending from the prisms 43 and 44 toward the grating 14e to be shifted in the V direction against a first beam B1 extending from the prisms 43 and 44 toward the laser chamber 10. However, the first beam B1 and the second beam B2 are parallel to each other. An acceptable range of error for the difference in the directions of the beam axes of the first and second beams B1 and B2 is preferably ±1°, and more preferably ±0.5°.

2.2 Operation

A high voltage applied across the discharge electrodes 11a and 11b causes electric discharge between the discharge electrodes 11a and 11b. The energy of the electric discharge causes laser medium in the laser chamber 10 to be excited and to shift to a high energy level. The excited laser medium then shifts back to a low energy level to emit light having a wavelength according to the difference in the energy levels.

The light generated in the laser chamber 10 is emitted from the laser chamber 10 via the windows 10a and 10b. The light emitted from the window 10a of the laser chamber 10 is expanded in the V direction by the prisms 43 and 44. The light emitted from the prisms 43 and 44 is expanded in the H direction by the prisms 14a to 14d and incident on the grating 14e.

The light incident on the grating 14e from the prisms 14a to 14d is reflected by the grooves of the grating 14e and diffracted to directions according to the wavelength of the light. The grating 14e is in a Littrow arrangement such that the angle of incidence of the light incident on the grating 14e from the prisms 14a to 14d coincides with the angle of diffraction of the diffracted light having a desired wavelength. This causes the light having the desired wavelength to return to the laser chamber 10 via the prisms 14a to 14d and the prisms 43 and 44.

The prisms 14a to 14d reduce the beam width of the diffracted light from the grating 14e in the H direction. The prisms 43 and 44 reduce the beam width of the light from the prism 14a in the V direction. The light emitted from the prisms 43 and 44 is thus returned via the window 10a to the electric discharge space in the laser chamber 10.

The output coupling mirror 15 transmits and outputs a part of the light outputted from the window 10b of the laser chamber 10 and reflects and returns another part to the laser chamber 10.

The light thus emitted from the laser chamber 10 reciprocates between the line narrow optical system 14 and the output coupling mirror 15, being amplified every time it passes through the electric discharge space between the discharge electrodes 11a and 11b, thus causing laser oscillation. The light is narrow-banded as it is returned by the line narrow optical system 14. Further, the arrangement of the windows 10a and 10b described above, the coating on the prisms 43 and 44, and the coating on the prisms 14a to 14d cause a polarized light component polarized in the H direction to be selected. The light thus amplified is outputted from the output coupling mirror 15 as the laser beam. The laser beam has a wavelength of the vacuum ultraviolet region and the wavelength is approximately 193.4 nm.

According to the first embodiment, the beam width is expanded by the prisms 43 and 44 in the V direction and the energy density of the light incident on the grating 14e is reduced. Increase in the surface temperature of the grating 14e is thus suppressed. Accordingly, as compared to the case where the beam width is not expanded in the V direction, the refractive index distribution of the inert gas in the vicinity of the surface of the grating 14e is reduced. Thus, deformation of the wavefront of the light diffracted by the grating 14e is suppressed, and widening of the spectral width of the laser beam outputted from the laser apparatus is suppressed. Further, reducing the energy density of the light incident on the diffracting surface of the grating 14e suppresses deterioration of the diffracting surface of the grating 14e. As a result, reduction in the diffraction efficiency of the grating 14e is suppressed and the lifetime of the grating 14e is extended.

2.3 Compensation for Wavelength Dispersion

The prisms 43 and 44 perform not only the beam expansion in the V direction but also wavelength dispersion in a plane parallel to the VZ plane. The optical path axis of the beam incident on the grating 14e from the prisms 43 and 44 where the oscillation wavelength is $\lambda 1$ is thus slightly different from that Where the oscillation wavelength is $\lambda 2$. The long dashed short dashed line in FIG. 2 shows the optical path axis where the oscillation wavelength is $\lambda 1$. The long dashed double-short dashed line in FIG. 2 shows the optical path axis where the oscillation wavelength is $\lambda 2$. If the oscillation wavelength changes, for example, from 193.300 nm to 193.457 the pointing of the laser beam in the V direction shifts by 0.1 mrad at every one reciprocating trip the optical resonator. The pointing of the laser beam in the V direction shifts by 0.6 mrad at the maximum in six reciprocating trips in the optical resonator. In FIG. 2, the difference in the optical path axes is exaggerated.

Accordingly, the change in the oscillation wavelength may cause the pointing of the laser beam outputted from the optical resonator to be shifted in the V direction. This may worsen the beam profile, the beam divergence, or the beam pointing of the laser beam.

Thus, according to the first embodiment, the plane of dispersion of the grating 14e is slightly inclined against a plane perpendicular to the plane of dispersion of the prisms 43 and 44. Slightly inclining the plane of dispersion of the grating 14e causes a little wavelength dispersion in the V direction by the grating 14e. This compensates the wavelength dispersion in the V direction caused by the prisms 43 and 44. Here, the plane of dispersion of the prisms 43 and 44 is a plane substantially perpendicular to both of the surfaces 18 and 19. The plane of dispersion of the grating 14e is a plane perpendicular to a direction of each groove formed on the grating 14e.

As shown in FIG. 1, a first axis substantially perpendicular to the diffracting surface of the grating 14e is an S axis. A second axis substantially perpendicular to the S axis and substantially parallel to the plane of dispersion of the grating 14e is a P axis. An axis substantially perpendicular to both of the S and P axes is a Q axis. Here, the diffracting surface of the grating 14e is a plane on which the light outputted from the laser chamber 10 is incident and the multiple grooves are formed. The S, P, and Q axes are movable according to change of the position and the posture of the grating 14e.

Further, as shown in FIG. 1, an axis substantially parallel to the beam axis of the light incident on the grating 14e is a Z1 axis. An axis substantially perpendicular to both of the Z1 and V axes is an H1 axis.

In the first embodiment, the plane of dispersion of the grating 14e is inclined by inclining the grating 14e about each of the P and S axes. Compensating for the wavelength dispersion achieved by inclining the grating 14e, will be described with reference to FIGS. 3A to 3F.

Figure 3A:
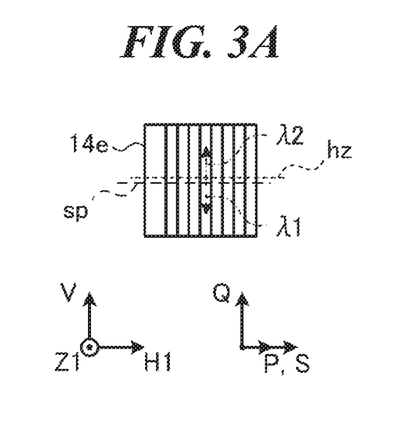
FIGS. 3A to 3C relationship between a grating 14e and an optical path axis of an incident beam where a plane of dispersion of the grating 14e is not inclined.
Figure 3B:
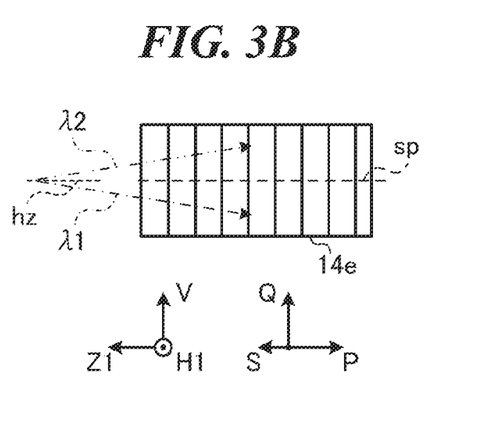
Figure 3C:
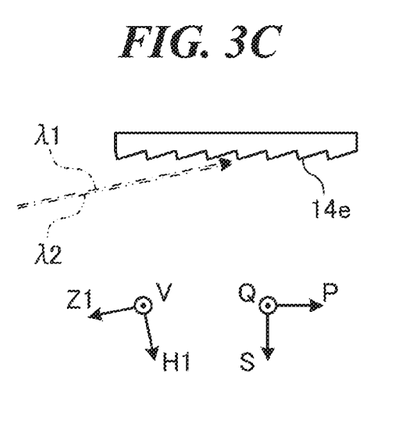

FIGS. 3A to 3C show a relationship between the grating 14e and the optical path axis of the incident beam where the plane of dispersion of the grating 14e is not inclined. FIGS. 3A, 3B, and 3C show the grating 14e as viewed along the Z1, H1, and Q axes, respectively. In these figures, the difference in the optical path axes between the case where the oscillation wavelength is $\lambda 1$ and the case where the oscillation wavelength is $\lambda 2$ is exaggerated. These optical path axes are each shifted to the V direction or the −V direction due to the wavelength dispersion caused by the prisms 43 and 44. In FIGS. 3A to 3C, the plane of dispersion sp of the grating 14e is not inclined against a plane hz, which is a plane crossing the plane of dispersion of the prisms 43 and 44 at right angles. In that case, the Q axis and the V axis are substantially parallel to each other. Here, the plane hz parallel to the HZ plane shown in FIGS. 1 and 2. The plane of dispersion sp of the grating 14e is parallel to the SP plane in FIGS. 3A to 3C.

As shown in FIGS. 3A to 3C, in the case where the plane of dispersion sp of the grating 14e is not inclined, the light where the oscillation wavelength is $\lambda 1$ and the light where the oscillation wavelength is $\lambda 2$ are Incident on the diffracting surface of the grating 14e at substantially the same angles of incidence with each other. Accordingly, the light where the oscillation wavelength is $\lambda 1$ and the light where the oscillation wavelength is $\lambda 2$ are diffracted at the grating 14e without compensation for the shifts described above.

Figure 3D:
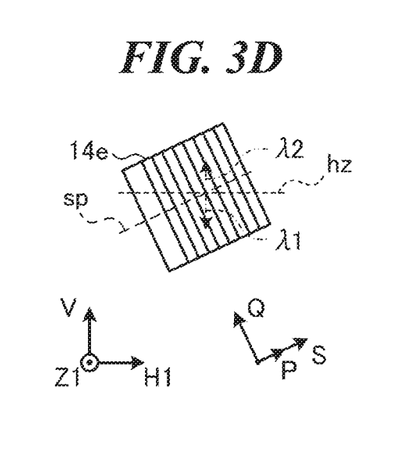
FIGS. 3D to 3F show a relationship between the grating 14e and the optical path axis of the incident beam here the plane of dispersion of the grating 14e is inclined.
Figure 3E:
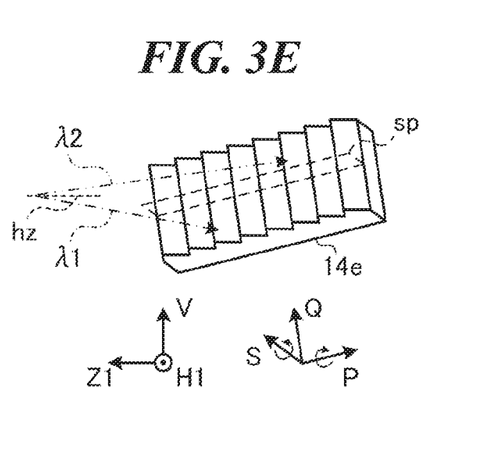
Figure 3F:
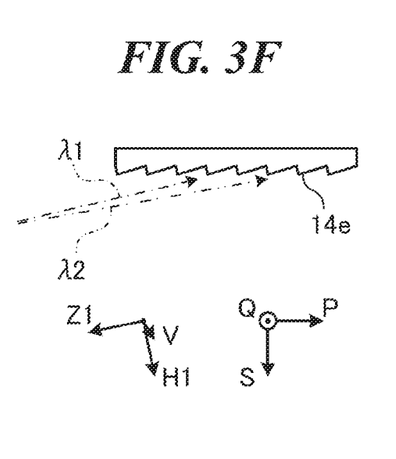

FIGS. 3D to 3F show a relationship between the grating 14e and the optical path axis of the incident beam where the plane of dispersion of the grating 14e is inclined. FIGS. 3D, 3E, and 3F show the grating 14e as viewed along the Z1, H1, and Q axes, respectively. In these figures, the difference in the optical path axes between the case where the oscillation wavelength is $\lambda 1$ and the case where the oscillation wavelength is $\lambda 2$ is exaggerated. These optical path axes are h shifted to the V direction or the −V direction due to the wavelength dispersion caused by the prisms 43 and 44. In FIGS. 3D to 3F, the plane of dispersion sp of the grating 14e is inclined against the plane hz. In that case, the Q axis and the V axis are non-parallel to each other.

As shown in FIGS. 3D to 3F, in the case where the plane of dispersion sp of the grating 14e is inclined, the light where the oscillation wavelength is λ1 and the light where the oscillation wavelength is λ2 are incident on the diffracting surface of the grating 14e at different angles of incidence from each other. Accordingly, it is possible that the angle of incidence of the light incident on the grating 14e here the oscillation wavelength is λ1 and the angle of diffraction of the light having the wavelength λ1 diffracted by the grating 14e coincide with each other, while the angle of incidence of the light incident on the grating 14e where the oscillation wavelength is λ2 and the angle of diffraction of the light having the wavelength λ2 diffracted by the grating 14e coincide with each other. This compensates for the shift in the optical path axes.

In the case where the grating 14e is inclined, it is preferable that the respective planes of dispersion of the prisms 14a to 14d substantially coincide with each other. In that case, the plane of dispersion of the grating 14e is inclined against the plane of dispersion of each of the prisms 14a to 14d. The plane of dispersion of each of the prisms 14a to 14d is a plane substantially perpendicular to both of the surfaces 18 and 19. Alternatively, the plane of dispersion of one prism of the prisms 14a to 14d and the plane of dispersion of the grating 14e are both inclined against the plane crossing the plane of dispersion of the prisms 43 and 44 at right angles.

In one example, if the magnification of the beam width in the V direction by the prisms 43 and 44 is 2, preferable that the grating 14e is inclined about the S axis in a counterclockwise direction by 0.14° and about the P axis in a counterclockwise direction by 0.35°. An installation surface for the grating 14e may be processed such that the grating 14e is installed in such posture. Alternatively, the bottom face of the substrate of the grating 14e may be processed such that the grating 14e is installed in such posture. Alternatively, a shim may be inserted under the bottom face of the grating 14e or on the holder 16e to incline the plane of dispersion of the grating 14e.

Figure 4:
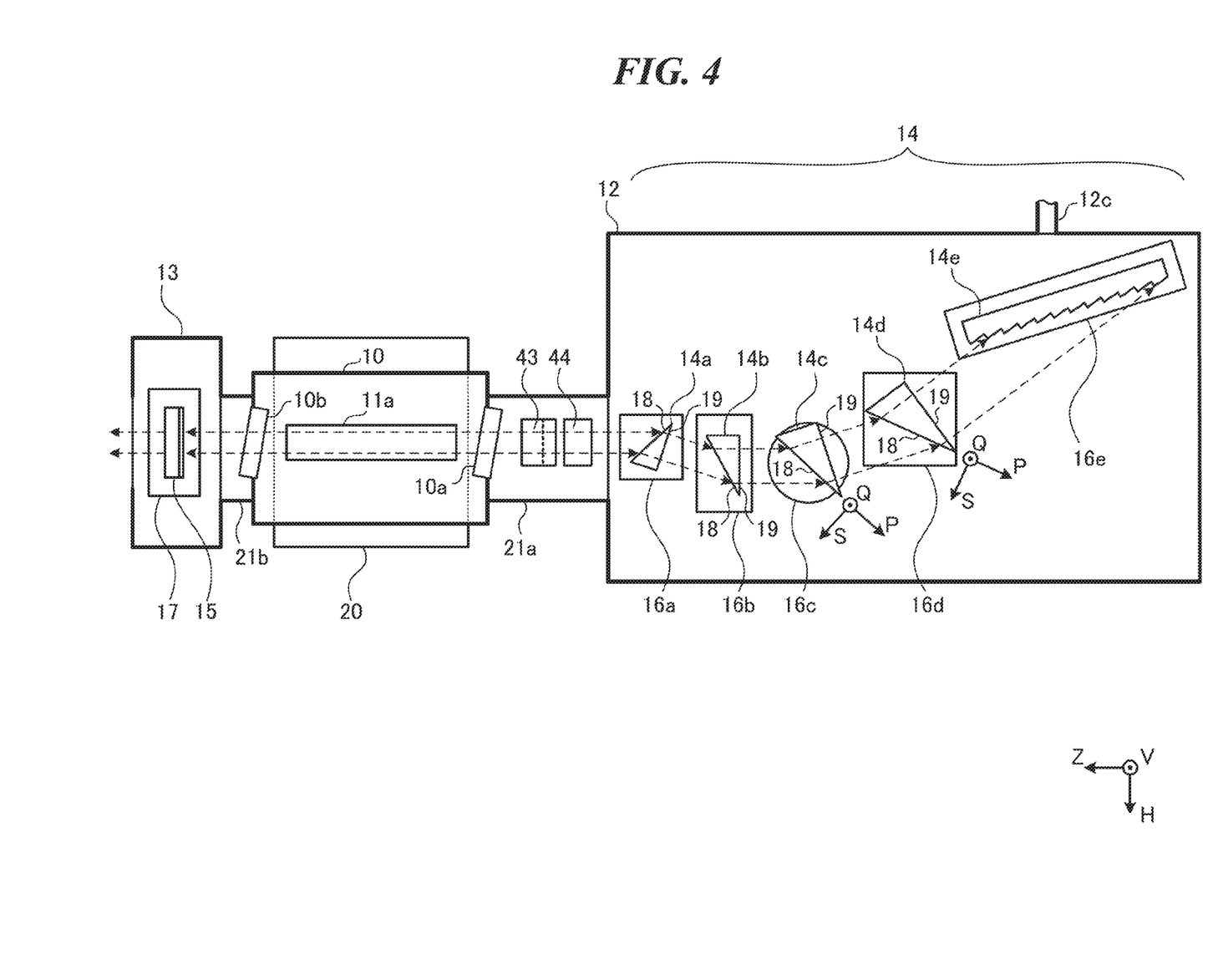
FIG. 4 schematically shows a configuration of a laser apparatus according to a second embodiment of the present disclosure.

3. Laser Apparatus with Inclined Prism of Second Beam Expander that Compensates for Wavelength Dispersion Caused by First Beam Expander FIG. 4 schematically shows a configuration of a laser apparatus according to a second embodiment of the present disclosure. FIG. 4 shows an internal configuration of the laser apparatus as viewed in a direction substantially parallel to the direction of electric discharge between the discharge electrodes 11a and 11b. In the second embodiment, instead of inclining the plane of dispersion of the grating 14e against the plane crossing the plane of dispersion of the prisms 43 and 44 at right angles, the plane of dispersion of at least one prism of the second beam expander is inclined. This compensates for the wavelength dispersion caused by the first beam expander.

As shown in FIG. 4, a third axis of the prism 14c substantially perpendicular to the surface 18 where the beam is refracted is an S axis. A fourth axis substantially perpendicular to the S axis and substantially parallel to the plane of dispersion of the prism 14c is a P axis. An axis substantially perpendicular to both of the S and P axes Q axis. Here, the surface 18 of the prism 14c is the surface on which the beam outputted from the laser chamber 10 is incident. The S, P, and Q axes are movable according to change of the position and the posture of the prism 14c.

S, P, and Q axes of the prism 14d are also defined as the same way with those of the prism 14c.

In one example, if the magnification of the beam width in the V direction by the prisms 43 and 44 is 2, it is preferable that the prism 14c is inclined about the S axis in a counterclockwise direction by −0.23° and about the P axis in a counterclockwise direction by 0.057°. Alternatively, instead of inclining the prism 14c, it is preferable that the prism 14d is inclined about the S axis in a counterclockwise direction by −0.074° and about the P axis in a counterclockwise direction by −0.20°. An installation surface for the prism 14c or 14d may be processed such that the prism 14c or 14d is installed in such posture. Alternatively, the bottom face of the substrate of the prism 14c or 14d may be processed such that the prism 14c or 14d is installed in such posture. Alternatively, a shim may be inserted under the bottom face of the prism 14c or 14d or on the holder 16c or 16d to incline the plane of dispersion of the prism 14c or 14d.

Inclining the plane of dispersion of the prism 14c or 14d causes a little wavelength dispersion in the V direction. This compensates for the wavelength dispersion in the V direction caused by the prisms 43 and 44.

If the plane of dispersion of one of the prisms 14a to 14d is inclined, it is preferable that the planes of dispersion of the other prisms of the prisms 14a to 14d and the grating 14e are not inclined. In that case, the planes of dispersion of the prisms other than the one inclined prism coincide with the plane of dispersion of the grating 14e. The plane of dispersion of the one inclined prism is inclined against the planes of dispersion of the prisms other than the one inclined prism and the plane of dispersion of the grating 14e. Alternatively, the planes of dispersion of two or more prisms of the prisms 14a to 14d may be inclined against the plane crossing the planes of dispersion of the prisms 43 and 44 at right angles.

The inclined prism where the plane of dispersion is inclined to compensate for the wavelength dispersion is preferably the prism 14c capable of being rotated around the axis parallel to the V axis to adjust the oscillation wavelength or the prism 14d nearer to the grating 14e than the prism 14c. This compensates for the wavelength dispersion caused by the prism 43 and 44, even if the prism 14c is rotated around the axis parallel to the V axis to change the oscillation wavelength of the laser. Alternatively, in the case where the prism 14b is capable of being rotated around an axis parallel to the V axis the plane of dispersion of one prism of the prisms 14b, 14c, and 14d may be inclined to compensate for the wavelength dispersion.

In other aspects, the second embodiment is substantially the same as the first embodiment.

4. Case Where First Beam Expander is Inverted Upside Down

Figure 5:
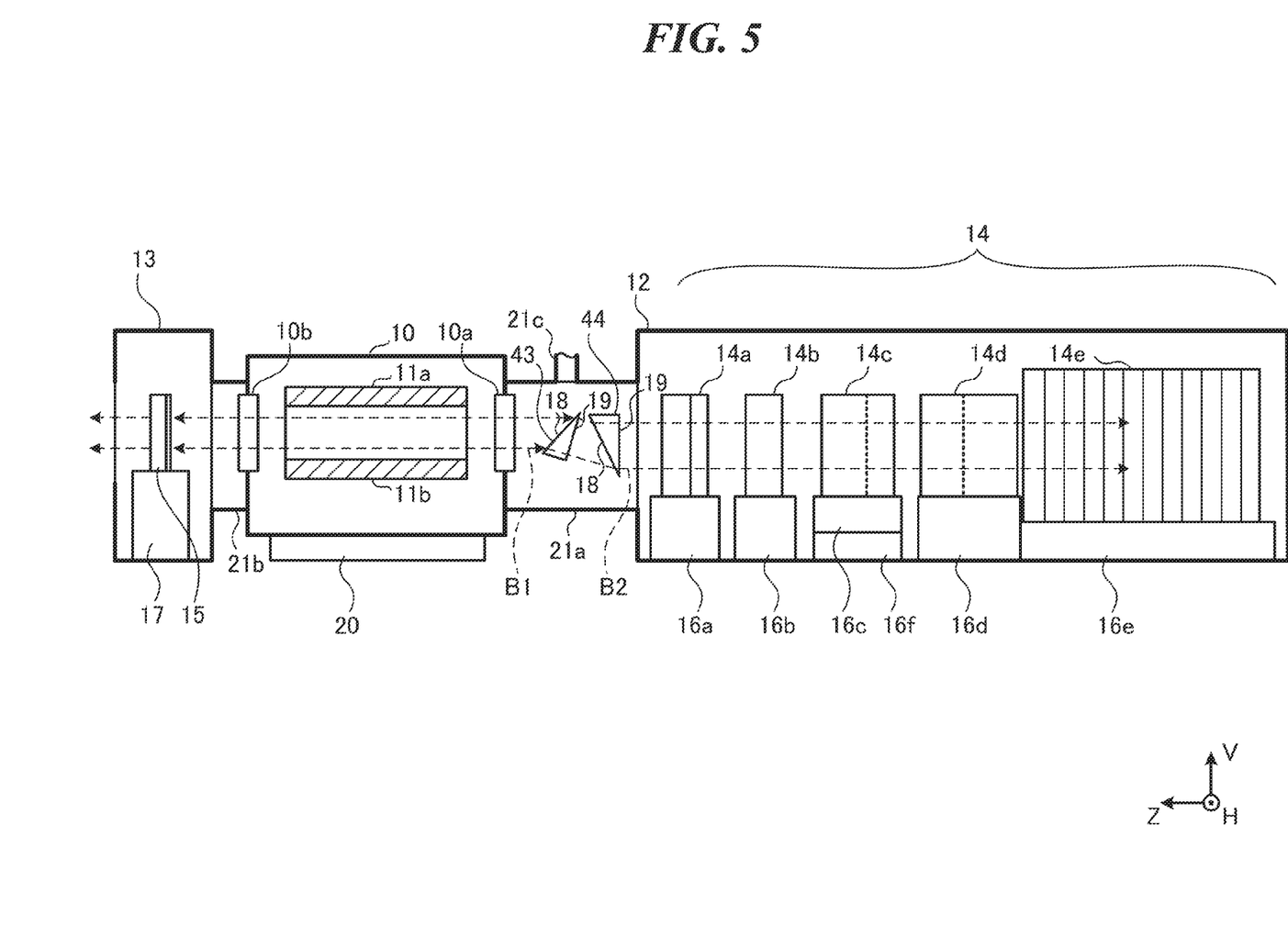
FIG. 5 schematically shows a configuration of a laser apparatus according to a third embodiment of the present disclosure.

FIG. 5 schematically shows a configuration of a laser apparatus according to a third embodiment of the present disclosure. FIG. 5 shows an internal configuration of the laser apparatus as viewed in a direction substantially perpendicular to the direction of electric discharge between the discharge electrodes 11a and 11b. In the third embodiment, the prisms 43 and 44 cause the second beam B2 extending from the prisms 43 and 44 toward the grating 14e to be shifted in the −V direction against the first beam B1 extending from the prisms 43 and 44 toward the laser chamber 10. Namely, the prisms 43 and 44 in the third embodiment are inverted upside down as compared to those in the first embodiment.

In the third embodiment, the direction of inclination of the grating or the prism is opposite to that in the first or second embodiment.

In other aspects, the third embodiment substantially the same as the first or second embodiment.

In one example, if the magnification of the beam width in the V direction by the prisms 43 and 44 is 2, it is preferable that the grating 14e is inclined about the S axis in a counterclockwise direction by −0.14° and about the P axis counterclockwise direction by −0.35°.

In another example, if the magnification of the beam width in the V direction by the prisms 43 and 44 is 2, it is preferable that the prism 14c is inclined about the S axis in a counterclockwise direction by 0.23° and about the P axis in a counterclockwise direction by −0.057°. Alternatively, instead of inclining the prism 14c, it is preferable that the prism 14d is inclined about the S axis in a counterclockwise direction by 0.074° and about the P axis in a counterclockwise direction by −0.20°.

The absolute value of the angle of inclination of the grating 14e about the S axis is preferably 0.084° or more and 0.29° or less.

The absolute value of the angle of inclination of the grating 14e about the P axis is preferably 0.12° or more and 0.64° or less.

The absolute value of the angle inclination of the prism 14c about the S axis is preferably 0.14° or more and 0.40° or less.

The absolute value of the angle of inclination of the prism 14c about the P axis is preferably 0.034° or more and 0.34° or less.

The absolute value of the angle of inclination of the prism 14d about the S preferably 0.046° or more and 0.16° or less.

The absolute value of the angle of inclination of the prism 14d about the P axis is preferably 0.12° or more and 0.36° or less.

5. Angle Changing Mechanism for Grating

Figure 6A:
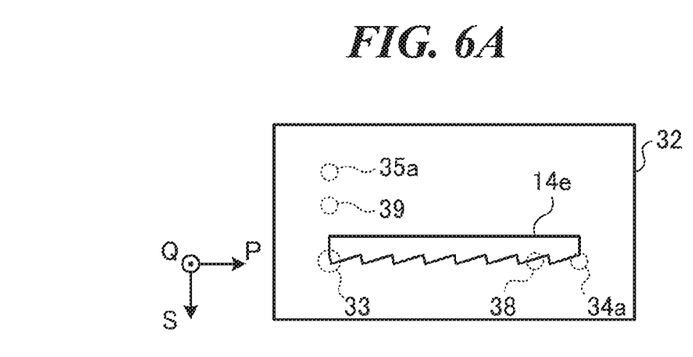
FIGS. 6A to 6C schematically show an angle changing mechanism capable of being used in a laser apparatus according to a fourth embodiment of the present disclosure.
Figure 6B:
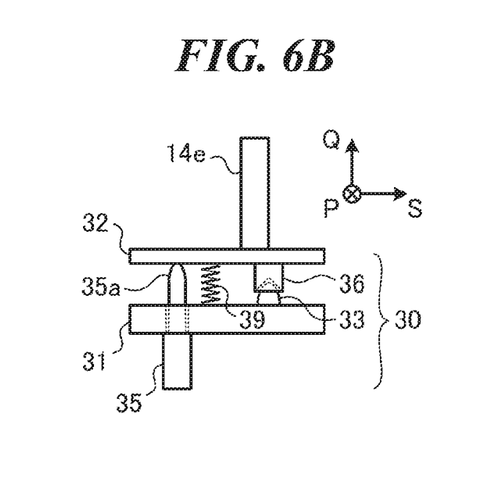
Figure 6C:
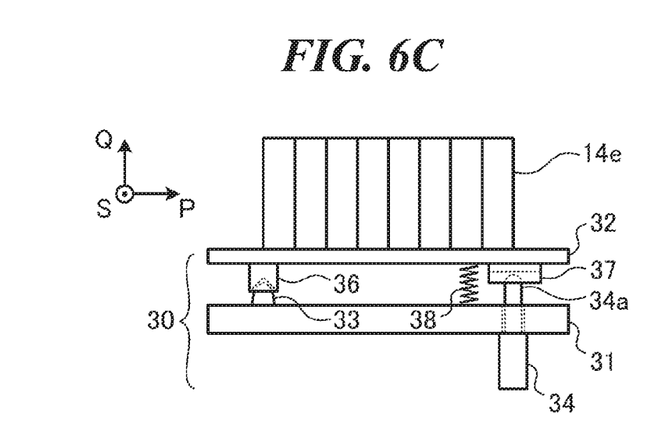

FIGS. 6A to 6C schematically show an angle changing mechanism capable of being used in a laser apparatus according to a fourth embodiment of the present disclosure. FIGS. 6A, 6B, and 6C show the grating 14e and the angle changing mechanism as viewed in −Q, P, and −S directions, respectively in the fourth embodiment, the angle of inclination of the grating 14e is adjustable.

An angle changing mechanism 30 shown in FIGS. 6A to 6C includes a first plate 31, a second plate 32, a projection 33, a first micrometer 34, and a second micrometer 35. The first plate 31 is fixed to the holder 16e described with reference to FIG. 2. The projection 33, the first micrometer 34, and the second micrometer 35 are fixed to the first plate 31. The first micrometer 34 is provided at a position shifted from the protection 33 in the P direction. The second micrometer 35 is provided at a position shifted from the projection 33 in the −S direction.

The second plate 32 is supported by the projection 33, the first micrometer 34, and the second micrometer 35. The grating 14e is mounted on the top face of the second plate 32.

A mount portion 36 having a cone-shaped depression is provided on the bottom face of the second plate 32. The position of the mount portion 36 right under the diffracting surface of the grating 14e. By receiving the projection 33 in the cone-shaped depression, the mount portion 36 is positioned at one point.

A mount portion 37 with a groove having a V-shaped section provided on the bottom face of the second plate 32. The position of the mount portion 37 is right under the diffracting surface of the grating 14e and is spaced apart from the mount portion 36. The direction of the groove having the V-shaped section is parallel to the diffracting surface of the grating 14e. By receiving a head portion 34a of the first micrometer 34 in the groove having the V-shaped section, the mount portion 37 is positioned such that the diffracting surface of the grating 14e is substantially parallel to a straight line connecting the head portion 34a of the first micrometer 34 and the projection 33.

Further, by receiving a head portion 35a of the second micrometer 35 at the bottoms face of the second plate 32, the grating 14e is supported and positioned at three points.

A spring having a stress in the direction to narrow the gap b the first plate 31 and the second plate 32 is provided in the vicinity of the first micrometer 34. A spring 39 having stress in the direction to narrow the gap bet Keen the first plate 31 and the second plate 32 is provided in the vicinity of the second micrometer 35.

The first micrometer 34 is capable of adjusting the height of the head portion 34a by an unillustrated control device. This allows the inclination of the grating 14e to be changed about an axis substantially parallel to the S axis.

The second micrometer 35 is capable of adjusting the height of the head portion 35a by an unillustrated control device. This allows the inclination of the grating 14e to be changed about an axis substantially parallel to the P axis.

According to the fourth embodiment, even if the characteristic the wavelength dispersion are changed by thermal deformation of the optical elements of the laser apparatus, the angle of inclination of the grating 14e can be re-adjusted to compensate for the wavelength dispersion.

Here, the description is made for a case where the angle of inclination of the grating 14e is adjusted. However, substantially the same mechanism may be used to adjust the angle of inclination of the prism 14c or 14d.

6. Angle Changing Mechanism for Prism

Figure 7A:
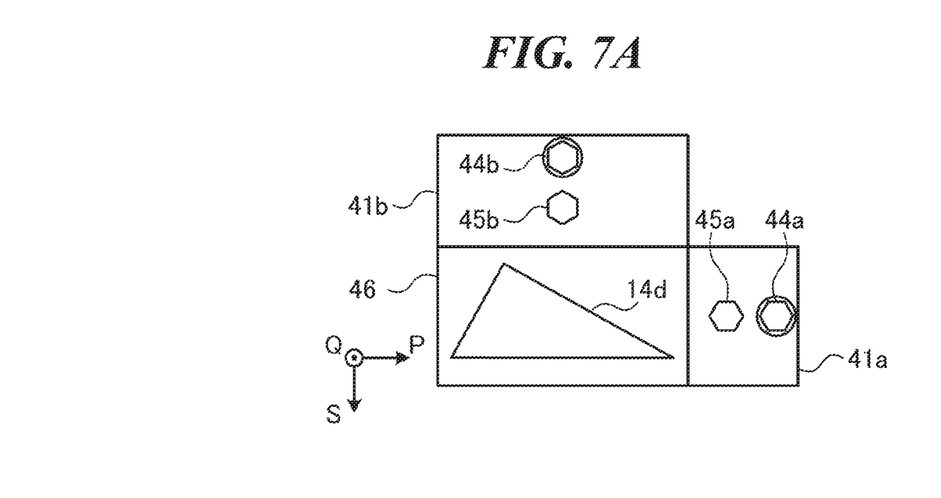
FIGS. 7A to 7C schematically show an angle changing mechanism capable of being used in a laser apparatus according to a fifth embodiment of the present disclosure.
Figure 7B:
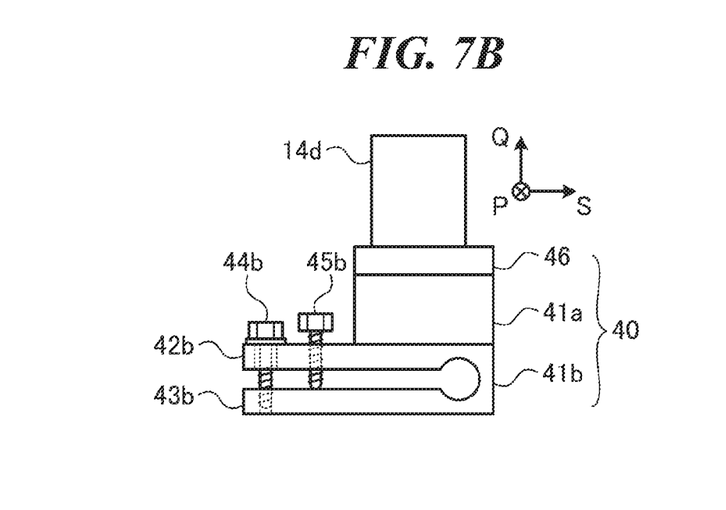
Figure 7C:
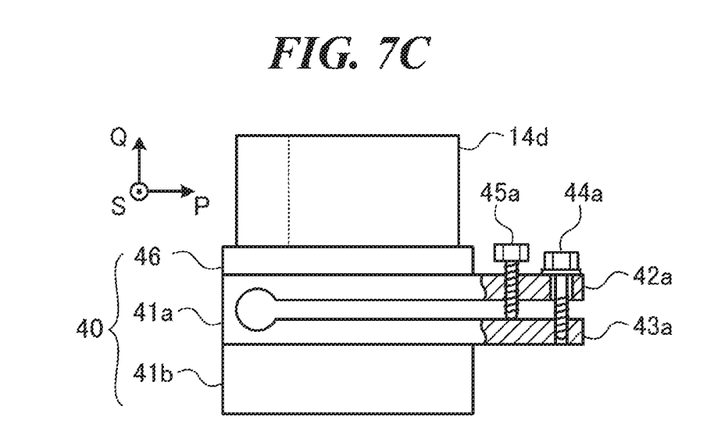

FIGS. 7A to 7C schematically show an angle changing mechanism capable of being used in a laser apparatus according to a fifth embodiment of the present disclosure. FIGS. 7A, 7B, and 7C show the prism 14d and the angle changing mechanism s wed in the −Q, P, and −S directions, respectively. In FIG. 7C, a part of the angle changing mechanism is shown by its section. In the fifth embodiment, the angle of inclination of the prism 14d is adjustable.

An angle changing mechanism 40 shown in FIGS. 7A to 7C includes a first hinge 41a, a second hinge 41b, and a plate 46.

The first hinge 41a is configured by a plate folded in half. The first hinge 41a includes a movable portion 42a at one half defined by a thin fold and an anchored portion 43 at the other half. The thin fold of the first hinge 41a is substantially parallel to the S axis.

The second hinge 41b is configured by another plate folded in half. The second hinge 41b includes a movable portion 42b at one half defined by a thin fold and an anchored portion 43b at the other half. The thin fold of the second hinge 41b is substantially parallel to the P axis.

The anchored portion 43b of the second hinge 41b is anchored to the holder 16d described with reference to FIG. 2. The anchored portion 43a of the first hinge 41a is anchored to the movable portion 42b of the second hinge 41b. The plate 46 is mounted on the movable portion 42a of the first hinge 41a. The prism 14d is mounted on the plate 46.

A first bolt 44a penetrates a through-hole of the movable portion 42a of the first hinge 41a and is screwed to the anchored portion 43a. The head portion of the first bolt 44a does not pass through the through-hole of the movable portion 42a and thus restricts the movable portion 42a going away from the anchored portion 43a. Namely, the first bolt 44a restricts opening of the first hinge 41a.

A second bolt 45a is screwed to the movable portion 42a of the first hinge 41a and the tip of the second bolt 45a reaches the anchored portion 43a. The second bolt 45a thus restricts the movable portion 42a getting close to the anchored portion 43a. Namely, the second bolt 45a restricts closing of the first hinge 41a.

Accordingly, the angle of the first hinge 41a is adjusted and the inclination of the prism 14d is adjusted about an axis substantially parallel to the S axis.

The configuration of the second hinge 41b is substantially the same as that of the first hinge 41a. The constituent elements of the second hinge 41b corresponding to those of the first hinge 41a are illustrated with corresponding reference symbols with "b" instead of "a" in the last digit and a detailed description is omitted. By using the second hinge 41b, the inclination of the prism 14d is adjusted about an axis substantially parallel to the P axis.

According to the fifth embodiment, even if the characteristics of the wavelength dispersion are changed by thermal deformation of the optical elements of the laser apparatus, the angle of inclination of the prism 14d can be re-adjusted to compensate for the wavelength dispersion.

Here, the description is made for the case where the angle of inclination of the prism 14d is adjusted. However, substantially the same mechanism may be used to adjust the angle of inclination of another prism or the angle of inclination of the grating 14e.

7. Others

The above descriptions are intended to be only illustrative rather than being limiting. Accordingly, it will be clear to those skilled in the art that various changes may be made to the embodiments of the present disclosure without departing from the scope of the appended claims.

The terms used in the present specification and the appended claim are to be interpreted as not being limiting. For example, the term "include" or "included" should be interpreted as not being limited to items described as being included. Further, the term "have" should be interpreted as not being limited to items described as being had. Furthermore, the modifier "a" or "an" as used in the present specification and the appended claims should be interpreted as meaning "at least one" or "one or more".

The invention claimed is:

1. A laser apparatus comprising:
a laser chamber in which a pair of discharge electrodes is provided;
a first beam expander configured to expand a beam width of a beam outputted from the laser chamber at least in a first direction substantially parallel to a direction of electric discharge between the discharge electrodes; and
a line narrow optical system including:
a second beam expander configured to expand a beam width of the beam outputted from the laser chamber at least in a second direction substantially perpendicular to the first direction, the second beam expander including at least one optical element; and
a grating configured to perform wavelength dispersion of the beam expanded by the first and second beam expanders, the wavelength dispersion being performed in a plane substantially parallel to the second direction, wherein
the first beam expander includes first and second prisms provided such that a first beam extending from the first beam expander toward the laser chamber and a second beam extending from the first beam expander toward the grating are substantially parallel to each other, and the grating is arranged such that a plane of dispersion of the grating is inclined against a plane perpendicular to a plane of dispersion of the first beam expander so as to compensate for wavelength dispersion caused by the first beam expander.

2. The laser apparatus according to claim 1, wherein the grating is inclined about a first axis substantially perpendicular to a diffracting surface of the grating and a second axis substantially perpendicular to the first axis and substantially parallel to the plane of dispersion of the grating.

3. The laser apparatus according to claim 2, wherein
an absolute value of an angle of inclination of the grating about the first axis is 0.084° or more and 0.29° or less, and
an absolute value of an angle of inclination of the grating about the second axis is 0.12° or more and 0.64° or less.

4. A laser apparatus comprising:
a laser chamber in which a pair of discharge electrodes is provided;
a first beam expander configured to expand a beam width of a beam outputted from the laser chamber at least in a first direction substantially parallel to a direction of electric discharge between the discharge electrodes; and
a line narrow optical system including:
a second beam expander configured to expand a beam width of the beam outputted from the laser chamber at least in a second direction substantially perpendicular to the first direction, the second beam expander including at least one optical element; and
a grating configured to perform wavelength dispersion of the beam expanded by the first and second beam expanders, the wavelength dispersion being performed in a plane substantially parallel to the second direction, wherein
the first beam expander includes first and second prisms provided such that a first beam extending from the first beam expander toward the laser chamber and a second beam extending from the first beam expander toward the grating are substantially parallel to each other,
the at least one optical element includes a third prism, and
the third prism is arranged such that a plane of dispersion of the third prism is inclined against a plane perpendicular to a plane of dispersion of the first beam expander so as to compensate for wavelength dispersion caused by the first beam expander.

5. The laser apparatus according to claim 4, wherein
the third prism has first and second surfaces through which the beam outputted from the laser chamber passes, and
the third prism is inclined about a third axis substantially perpendicular to the first surface and a fourth axis substantially perpendicular to the third axis and substantially parallel to the plane of dispersion of the third prism.

6. The laser apparatus according to claim 5, wherein
an absolute value of an angle of inclination of the third prism about the third axis is 0.046° or more and 0.40° or less, and
an absolute value of an angle of inclination of the third prism about the fourth axis is 0.034° or more and 0.36° or less.

7. The laser apparatus according to claim 4, further comprising:
a rotation mechanism configured to rotate one prism of the third prism and a prism of the at least one optical element provided nearer to the laser chamber than the third prism, the one prism being rotated around an axis parallel to the first direction.

8. A laser apparatus comprising:
a laser chamber in which a pair of discharge electrodes is provided;
a grating configured to perform wavelength dispersion of a beam outputted from the laser chamber;
a first beam expander provided in a beam path between the laser chamber and the grating and configured to expand a beam width of the beam at an incident position on the grating in a direction of a V axis, the V axis being an axis substantially parallel to a direction of electric discharge between the discharge electrodes; and
a second beam expander provided in the beam path between the laser chamber and the grating and configured to expand a beam width of the beam at the incident position on the grating in a direction of an H1 axis, the H1 axis being an axis substantially perpendicular to both of the V axis and a Z1 axis, the Z1 axis being an axis substantially parallel to a beam axis of the beam at the incident position on the grating, the second beam expander including at least one optical element, wherein
the first beam expander includes first and second prisms provided such that a first beam extending from the first beam expander toward the laser chamber and a second beam extending from the first beam expander toward the grating are substantially parallel to each other, and
the grating is arranged such that an SP plane of the grating is inclined against an H1Z1 plane, the SP plane being a plane of dispersion of the grating, the H1Z1 plane being a plane including both of the H1 axis and the Z1 axis.

9. The laser apparatus according to claim 8, wherein the grating is inclined about an S and a P axis, the S axis being an axis substantially perpendicular to a diffracting surface of the grating, the P axis being an axis substantially perpendicular to the S axis and substantially parallel to the SP plane.

10. The laser apparatus according to claim 9, wherein
an absolute value of an angle of inclination of the P axis against the H1Z1 plane is 0.084° or more and 0.29° or less, and
an absolute value of an angle of inclination of the S axis against the H1Z1 plane is 0.12° or more and 0.64° or less.

11. The laser apparatus according to claim 1, wherein the plane perpendicular to the plane of dispersion of the first beam expander is a plane perpendicular to the first direction.

12. The laser apparatus according to claim 4, wherein the plane perpendicular to the plane of dispersion of the first beam expander is a plane perpendicular to the first direction.

* * * * *